(12) United States Patent
Shan

(10) Patent No.: US 11,028,475 B2
(45) Date of Patent: Jun. 8, 2021

(54) METHOD FOR PREVENTING VACUUM PUMP PIPELINE FROM BLOCKAGE, AND CHEMICAL VAPOR DEPOSITION MACHINE

(71) Applicant: HKC Corporation Limited, Guangdong (CN)

(72) Inventor: Jianfeng Shan, Guangdong (CN)

(73) Assignee: HKC Corporation Limited, Shenzhen (CN)

( * ) Notice: Subject to any disclaimer, the term of this patent is extended or adjusted under 35 U.S.C. 154(b) by 347 days.

(21) Appl. No.: 16/316,348

(22) PCT Filed: Nov. 14, 2018

(86) PCT No.: PCT/CN2018/115304
§ 371 (c)(1),
(2) Date: Jan. 8, 2019

(87) PCT Pub. No.: WO2020/006956
PCT Pub. Date: Jan. 9, 2020

(65) Prior Publication Data
US 2020/0208262 A1 Jul. 2, 2020

(30) Foreign Application Priority Data
Jul. 4, 2018 (CN) .......................... 201810724322.9

(51) Int. Cl.
*C23C 16/44* (2006.01)

(52) U.S. Cl.
CPC ................. *C23C 16/4412* (2013.01)

(58) Field of Classification Search
CPC ............ C23C 16/4408; C23C 16/4404; C23C 16/4412; Y02C 20/30
See application file for complete search history.

(56) References Cited

U.S. PATENT DOCUMENTS

2007/0095282 A1   5/2007   Moon et al.

FOREIGN PATENT DOCUMENTS

| CN | 102304702 A | 1/2012 |
|----|-------------|--------|
| CN | 102560418 A | 7/2012 |
| CN | 203474891 U | 3/2014 |
| CN | 104074717 A | 10/2014 |
| CN | 206768209 U | 12/2017 |

*Primary Examiner* — Yuechuan Yu

(57) ABSTRACT

The present disclosure relates to the technical field of chemical vapor deposition coating equipment, and discloses a method for preventing vacuum pump pipeline from blockage, which includes the following steps: opening a gas source, and introducing reaction gas into a process chamber from the gas source; carrying out a coating reaction of a chemical vapor deposition machine in the process chamber; after coating, closing the gas source, and introducing heated inert gas into an air exhaust pipe connected to an outlet of a vacuum pump; turning on the vacuum pump, and introducing dust and exhaust gas in the process chamber into a exhaust gas treatment device through the air exhaust pipe. The present disclosure also provides a chemical vapor deposition machine applying the method for preventing the vacuum pump pipeline from blockage.

17 Claims, 3 Drawing Sheets

METHOD FOR PREVENTING VACUUM PUMP PIPELINE FROM BLOCKAGE, AND CHEMICAL VAPOR DEPOSITION MACHINE

FIELD

The disclosure generally relates to the technical field of chemical vapor deposition equipment, and more particularly relates to a method for preventing vacuum pump pipeline from blockage, and a chemical vapor deposition machine.

BACKGROUND

Chemical vapor deposition machine, also called vacuum coating machine, mainly refers to a kind of coating machine that the coating process needs to be carried out under a high vacuum degree. There are many kinds of chemical vapor deposition machines, including vacuum ion evaporation, magnetron sputtering, molecular beam epitaxy (MBE), pulsed laser deposition (PLD) and so on.

In the coating process, chemical reactions generate in the chemical vapor deposition machine, and reactant powder is produced during the chemical reaction. The reactant powder is then discharged from the reactant chamber to vacuum pump along the pipeline in the system, during which the probability of the reactant powder attaching on the inner wall of the pipeline of the vacuum pump would increase due to the changes of the temperature, pressure, and pumping efficiency of the pipeline in the system, as such the power may block the pipeline. This phenomenon of powder blockage will cause the exhaust of vacuum pump to be unsmooth, and the chamber in which the coating process is carried out will be unable to control the pressure and result a shutdown.

The blockage of the inner wall of the vacuum pump pipeline requires a shutdown of the reactant chamber, dismantlement of an outlet pipeline of the vacuum pump and washing the pipeline with water by maintenance personnel, then waiting for the pipeline to be air dried. The above maintenance procedure would take about 2 hours, and the production time will be reduced by 20 percent, thus the production efficiency and equipment utilization rate are reduced, while maintenance expenditure and production cost are increased.

SUMMARY

The object of the present disclosure is to provide a method for preventing the vacuum pump pipeline from blockage so as to effectively improve the phenomenon of powder adhesion and blocking in the vacuum pump pipeline.

In order to achieve the aim, the present disclosure adopts the following technical solutions:

a method for preventing a vacuum pump pipeline from blockage, includes the following steps:

opening a gas source from which a reaction gas is introduced into a process chamber;

carrying out a coating reaction of a chemical vapor deposition machine in the process chamber;

after coating, closing the gas source, and introducing heated inert gas into an air exhaust pipe connected to an outlet of a vacuum pump;

turning on the vacuum pump, and dust and exhaust gas in the process chamber are introduced into a exhaust gas treatment device through the air exhaust pipe.

As an alternative to the technical solution, after introducing heated inert gas into the air exhaust pipe, the method includes an operation of heat preservation the air exhaust pipe.

As an alternative to the technical solution, after the coating and before turning on the vacuum pump, the method includes an operation of heating an air inlet pipe connected to an air inlet of the vacuum pump.

As an alternative to the present technical solution, plating a coating layer for preventing dust adhesion on an inner wall of the air exhaust pipe to reduce an adhesion probability of powder on the inner wall of the air exhaust pipe.

The present disclosure also provides a chemical vapor deposition machine applying the method for preventing the vacuum pump pipeline from blocking, so as to reduce the adhesion probability of powder in the vacuum pump pipeline in the chemical vapor coating process.

To achieve this aim, the present disclosure adopts the following technical solution:

a chemical vapor deposition machine applying the method for preventing vacuum pump pipeline blockage, a vacuum pump, a process chamber and an exhaust gas treatment device, an air inlet pipe is connected with the vacuum pump and the process chamber therebetween, an air exhaust pipe is connected with the exhaust gas treatment device and the vacuum pump therebetween, one end of the air exhaust pipe close to the vacuum pump is communicated with a gas tube, the gas tube is configured to fill inert gas into the air exhaust pipe, and a first heating device is defined on the gas tube.

As an alternative to the technical solution, the air exhaust pipe is provided with a heat preservation device.

As an alternative to the technical solution, it also includes a second heating device arranged at one end of the air inlet pipe near the vacuum pump and/or a third heating device arranged at one end of the air exhaust pipe near the vacuum pump.

As an alternative to the technical solution, at least an inner side wall of an air inlet of the air exhaust pipe is coated with a coating layer for preventing dust adhesion.

As an alternative to the technical solution, the coating layer for preventing dust adhesion is a polytetrafluoroethylene layer.

As an alternative to the above solution, the present disclosure provides a chemical vapor deposition machine which includes a vacuum pump, a process chamber and an exhaust gas treatment device, an air inlet pipe is connected with the vacuum pump and the process chamber therebetween, and an air exhaust pipe is connected with the exhaust gas treatment device and the vacuum pump therebetween, the chemical vapor deposition machine further includes:

a coating layer, defined on inner side walls of the air inlet pipe and the air exhaust pipe and configured to prevent dust adhesion;

a gas tube, communicated with one end of the air exhaust pipe near the vacuum pump and configured to introduce inert gas into the air exhaust pipe;

a first heating device, defined on the gas tube and configured to heat inert gas in the gas tube;

a heat preservation device, defined on the air exhaust pipe and configured to perform heat preservation of the environment in the air exhaust pipe.

Beneficial effects: on one hand, the method for preventing the vacuum pump pipeline from blocking and the chemical vapor deposition machine provided by the present disclosure can increase the fluid pressure in the air exhaust pipe and enable gas and dust to flow out smoothly from the air exhaust pipe by charging hot inert gas into the air exhaust pipe connected to the vacuum pump through the gas tube. On one hand, the oxygen concentration in the air exhaust pipe can be reduced, and the reaction between the exhaust gas and oxygen can be reduced, thereby reducing the further generation of powder in the air exhaust pipe. Furthermore, by the hot inert gas, the ambient temperature in the air exhaust pipe can be increased and the molecular thermal movement of gas and powder molecules can be intensified, thus effectively reducing the adhesion of powder in the air exhaust pipe and improving the blockage of powder adhesion in the vacuum pump pipe. The improvement is simple, the implementation cost is low, and it is conducive to popularize on a large scale.

BRIEF DESCRIPTION OF THE DRAWINGS

To better illustrate the technical solutions that are reflected in various embodiments according to this disclosure or that are found in the prior art, the accompanying drawings intended for the description of the embodiments herein or for the prior art will now be briefly described, it is evident that the accompanying drawings listed in the following description show merely some embodiments according to this disclosure, and that those having ordinary skill in the art will be able to obtain other drawings based on the arrangements shown in these drawings without making inventive efforts.

LABELS ILLUSTRATION FOR DRAWINGS

TABLE 1

Figure 1:
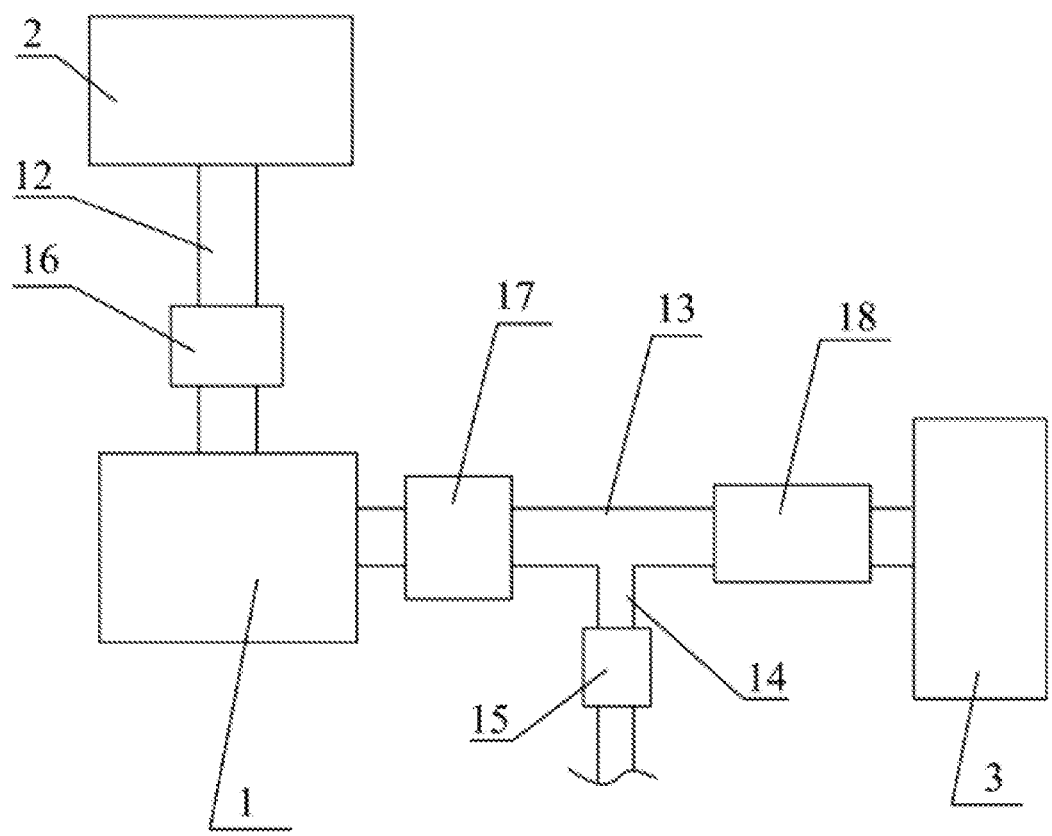
FIG. 1 is a structure diagram of the chemical vapor deposition machine provided by the exemplary embodiment of the present disclosure.

| Label | Name |
|---|---|
| 1 | vacuum pump |
| 12 | air inlet pipe |
| 13 | air exhaust pipe |
| 14 | gas tube |
| 15 | first heating device |
| 16 | second heating device |
| 17 | third heating device |
| 18 | heat preservation device |
| 19 | coating layer |
| 2 | process chamber |
| 3 | exhaust gas treatment device |

The realizing of the aim, functional characteristics, advantages of the present disclosure are further described in detail with reference to the accompanying drawings and the embodiments.

DETAILED DESCRIPTION

The technical solutions of the embodiments of the present disclosure will be clearly and completely described in the following with reference to the accompanying drawings. It is obvious that the embodiments to be described are only a part rather than all of the embodiments of the present disclosure. All other embodiments obtained by persons skilled in the art based on the embodiments of the present invention without creative efforts shall fall within the protection scope of the present invention.

It is to be understood that, all of the directional instructions in the exemplary embodiments of the present disclosure (such as top, down, left, right, front, back) can only be used for explaining relative position relations, moving condition of the elements under a special form (referring to figures), and so on, if the special form changes, the directional instructions changes accordingly.

In addition, the descriptions, such as the "first", the "second" in the present disclosure, can only be used for describing the aim of description, and cannot be understood as indicating or suggesting relative importance or impliedly indicating the number of the indicated technical character. Therefore, the character indicated by the "first", the "second" can express or impliedly include at least one character. n addition, the technical proposal of each exemplary embodiment can be combined with each other, however the technical proposal must base on that the ordinary skill in that art can realize the technical proposal, when the combination of the technical proposals occurs contradiction or cannot realize, it should consider that the combination of the technical proposals does not existed, and is not contained in the protection scope required by the present disclosure.

The present disclosure will be completely described in the following with reference to the accompanying drawings. It is to be understood that, the exemplary embodiments of the present disclosure and their corresponding descriptions are used for illustrating the present invention rather than restricting the present disclosure. In addition, for ease of description, the drawings only show parts of the structure related to the present disclosure, rather than all the structure.

During the coating process of the chemical vapor deposition machine, the reaction gas flows into the process chamber from the gas source, and after the reaction in the reaction chamber, by-products (including a large amount of dust) generated in the reaction and gases not involved in the reaction are pumped out by the vacuum pump to the exhaust gas treatment device. Because the diameters of the pipes between the process chamber and the vacuum pump, and between the vacuum pump and the exhaust gas treatment device are small, and the length of the pipes cannot be shortened, dust may accumulate on the inner wall of the pipe, causing the pipe to be blocked. And, in the exhausting process, especially the vacuum degree in the air exhaust pipe between the vacuum pump and the exhaust gas treatment device may gradually decrease, the exhaust gas concentration would increase, and the oxygen concentration would also increase rapidly, which may easily cause the exhaust gas to react with oxygen to generate powdery particles, and the temperature is lower due to the contact of the air exhaust pipe with the external environment, which may easily cause dust and powdery particles to adhere.

The present disclosure provides a method for preventing powder from being blocked in a vacuum pump pipeline, which prevents powder from adhering to the vacuum pump air exhaust pipe by introducing heating inert gas into the vacuum pump air exhaust pipe. By introducing heated inert gas into the air exhaust pipe, on the one hand, the pressure in the air exhaust pipe can be increased to promote the gas or dust in the air exhaust pipe to flow out smoothly from the air exhaust pipe to the exhaust gas treatment device. On the other hand, the oxygen concentration in the air exhaust pipe can be reduced, thereby reducing the probability that the exhaust gas reacts with oxygen to produce powdered particles. Furthermore, the heated inert gas can increase the ambient temperature in the air exhaust pipe, and intensify the molecular movement of molecules or dust, and the adhesion of powder to the inner wall of the air exhaust pipe is further reduced.

In the exemplary embodiment, the inert gas can be nitrogen gas, rare gas and other gases which are not easy to react, and the nitrogen gas is preferable for economic and performance considerations, and the heating temperature of nitrogen gas can be selected as 90 degrees to 100 degrees.

Since the outlet end of the vacuum pump connected to the air exhaust pipe is the area where the pressure rise changes the most, the exhaust gas concentration is the largest and powder adhesion is most likely to occur, as such the inlet for heating inert gas should be close to the outlet end of the vacuum pump. In order to prevent the temperature of the pipeline far away from the inert gas inlet from gradually decreasing due to the over-length of the air exhaust pipe, thus powder adhesion is generated sue to the decreasing of temperature, the air exhaust pipe can be preserved. Specifically, a heat preservation device can be defined on the air exhaust pipe to perform heat preservation of the ambient temperature inside the air exhaust pipe. The heat preservation device can be heat preservation cotton, such as glass wool layer and rock wool, which sleeves on a surface of the air exhaust pipe, or the heat preservation device can also be a heat exchange tube, enwound the air exhaust pipe along the length direction of the air exhaust pipe, for introducing heating fluid, the heat preservation device can also be a spirally arranged silicone rubber heating belt that can heat the pipe after being energized, the heat preservation device can further be other device that can achieve the heat preservation effect on the air exhaust pipe.

In order to further intensify the molecular thermal movement at the outlet end of the vacuum pump and reduce the accumulation and adhesion of dust at the inlet end of the air exhaust pipe, the pipeline at the inlet end of the air exhaust pipe can be heated.

In order to further reduce the blockage of powder on the inner wall of the pipeline, the air inlet pipe connected with the process chamber and the vacuum pump therebetween can be heated to intensify the thermal movements of gas molecules and powder molecules in the air inlet pipe, thereby reducing the probability of powder adhesion in the vacuum pump and at the air inlet and air outlet of the vacuum pump. The heating of the air inlet pipe can be selected to heat the whole air inlet pipe or to heat the part of the pipeline connected to the air inlet of the vacuum pump, thus ensuring the molecular activity in the vacuum pump while saving the cost.

Because the air inlet of the air exhaust pipe is easy to occur the powder accumulation, a coating layer can be further defined on the inner wall of a part of the pipeline at the air inlet end of the air exhaust pipe to prevent powder adhesion, and the material of the coating layer can be polytetrafluoroethylene. Polytetrafluoroethylene is a polymer compound formed by polymerization of tetrafluoroethylene, which has excellent properties of chemical stability, corrosion resistance, temperature resistance, non-tackiness, electrical insulation and aging resistance. Due to its chemical stability, it will not react with exhaust gas or powder in the air exhaust pipe. Because of its good temperature resistance, the performance difference is small in the range of −180 degrees to 260 degrees, so the heating the pipeline, heat preserving the pipeline or filling hot inert gas into the pipeline would not affect its performance. Because it is not sticky, it can prevent the dust from adhering on the air exhaust pipe, so the dust can be easily sucked away by the exhaust gas treatment device, thus effectively delaying the blockage caused by the adhesion of powder on the inner wall of the vacuum pump pipeline. The coating layer can also be made of other materials that can prevent powder from adhering, and the exemplary embodiment is not particularly limited.

The coating layer can also be arranged at the outlet of the air exhaust pipe and/or the middle section of the air exhaust pipe, or the coating layer can be defined on the entire inner surface of the air exhaust pipe to enhance the anti-powder blocking performance of the air exhaust pipe.

The method for preventing the vacuum pump powder from blocking can effectively improve the blocking phenomenon caused by powder adhering in the vacuum pump pipeline, the method is convenient to operate, simple and easy to implement, and the method has low implementation cost, and is beneficial to popularize on a large scale.

Figure 2:
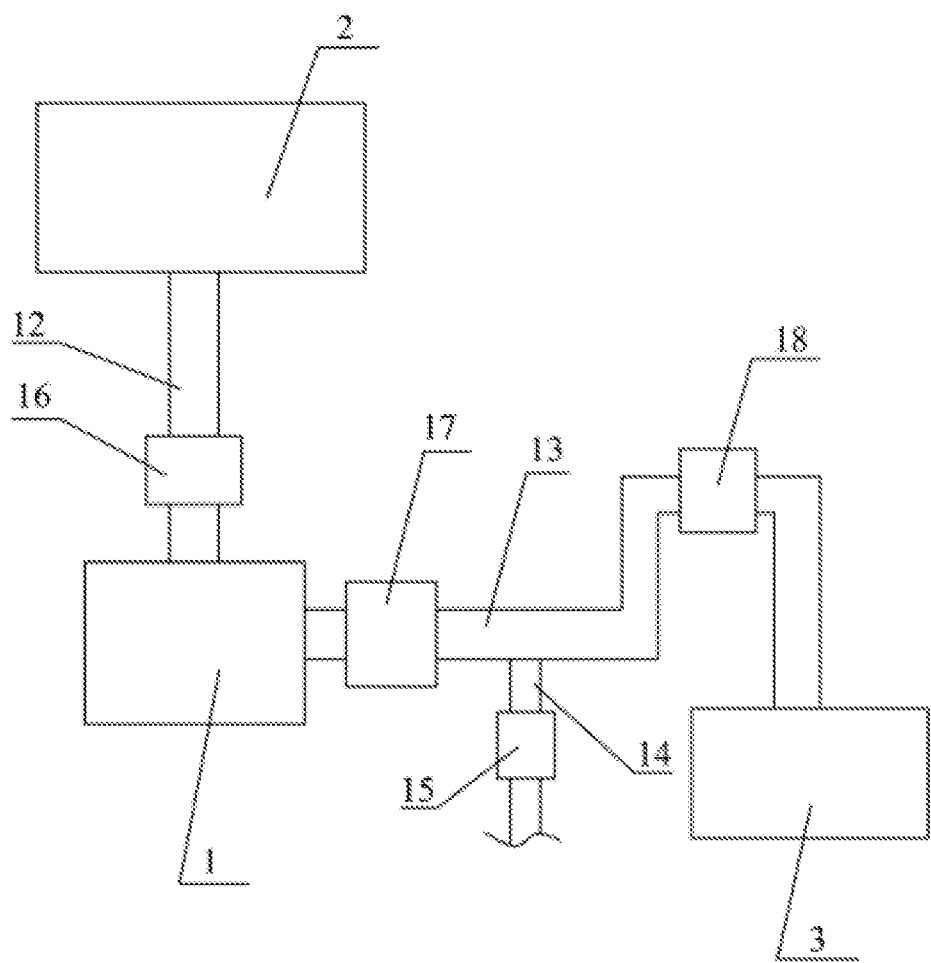
FIG. 2 is a structure diagram of another chemical vapor deposition machine provided by the exemplary embodiment of the present disclosure.

The exemplary embodiment also provides a chemical vapor deposition machine applying the method for preventing vacuum pump powder blocking as described above, referring to FIGS. 1 and 2, the machine includes a vacuum pump 1, a process chamber 2 and an exhaust gas treatment device 3, an air inlet pipe 12 is communicated between the process chamber 2 and the vacuum pump 1, and an air exhaust pipe 13 is connected with the vacuum pump 1 and the exhaust gas treatment device 3 therebetween. One end of the air exhaust pipe 13 near the vacuum pump 1 is communicated with a gas tube 14 for filling the air exhaust pipe 13 with hot inert gas, a first heating device 15 for heating the inert gas is defined on the gas tube 14, and the end of the gas tube 14 far away from the air exhaust pipe 13 is connected with an air source. The first heating device 15 may be a heat exchanger, the gas tube 14 is connected to the outlet of the heat exchanger, and the inlet of the heat exchanger connects to an inert gas tank or other device for storing inert gas. The first heating device 15 may also be another device that can be used to heat inert gas, and the exemplary embodiment is not particularly limited.

The air exhaust pipe 13 is provided with a heat preservation device 18, which can be the above-mentioned heat preservation layer, heat exchange tube, silicone rubber heating belt or other device capable of achieving the pipeline heat preservation function. When the heat preservation device 18 is a preservation layer such as a glass wool layer, it is optional to provide the preservation layer on the outer wall of the entire air exhaust pipe 13 to enhance the heat preservation effect on the air exhaust pipe 13. When the heat preservation device 18 is selected as a device that can heat and preserve heat, such as a heat exchange tube or a silicone rubber heating belt, the heat preservation device 18 may be arranged in the middle pipeline area of the air exhaust pipe 13, especially when the air exhaust pipe 13 has a vertical bent portion, referring to FIG. 2, dust tends to accumulate and adhere in the bent portion, so the heat preservation device 18 may be preferably arranged in the bent region to intensify the molecular thermal movement at the place where dust tends to accumulate in the air exhaust pipe 13, therefore, the probability of dust adhesion is reduced.

The outlet end of the air inlet pipe 12 is provided with a second heating device 16 for accelerating the movement speed of the gas or dust in the vacuum pump 1, so as to reduce the adhesion probability of the dust at the vacuum pump 1 and the inlet end of the air exhaust pipe 1. The inlet end of the air exhaust pipe 13 is provided with a second heating device 16 for intensifying the molecular thermal movement at the outlet of the vacuum pump 1. The second heating device 16 and the third heating device 17 may be selected as devices capable of local heating, such as hot compress bags adopting electric heating or other devices, and the exemplary embodiment is not particularly limited.

Figure 3:
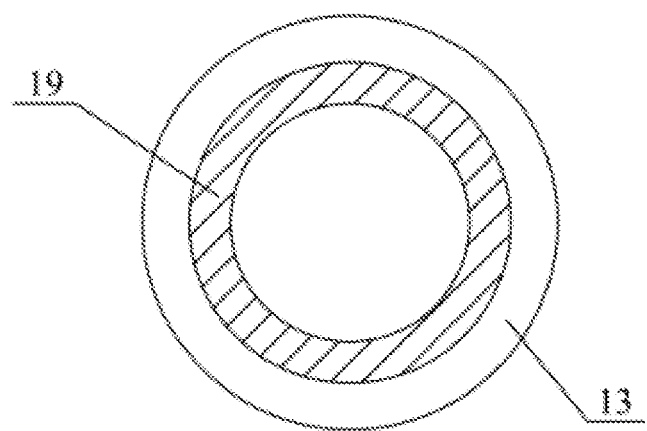
FIG. 3 is a cross section of the air exhaust pipe attached with the coating layer provided by the present disclosure.

Referring to FIG. 3, in order to further prevent dust from adhering in the air exhaust pipe 13, a coating layer 19 for preventing dust from adhering may be provided on the inner wall of the air exhaust pipe 13. The coating layer 19 may be provided at an area of the air exhaust pipe 13 where powder adhesion is likely to occur, such as an inlet end area of the air exhaust pipe 1. Since there will be a further increase in pressure of gas or dust at the outlet end of the air exhaust pipe 13, resulting in powder particles or dust adhering more easily at the outlet end of the air exhaust pipe 13 than at the middle of the air exhaust pipe 13, the coating layer 19 may also be provided at the outlet end area of the air exhaust pipe 13. When there is a bend in the air exhaust pipe 13, dust accumulation is also easily occurred at the bend, so that the above-mentioned coating layer 19 can be provided at the bend area of the air exhaust pipe 13 to reduce the probability of powder adhesion. The installation of the localized coating layer 19 can reduce the cost of defining the coating layer 19 at the whole of air exhaust pipe 13, and can also better reduce the probability of powder adhesion. In the specific implementation, the coating layer 19 may be provided for the entire air exhaust pipe 13. In order to ensure the adhesion prevention effect of the coating layer 19, the thickness of the coating layer 19 may be selected to be 0.6 millimeters to 2 millimeters, and most preferably 2 millimeters.

According to the chemical vapor deposition machine provided by the exemplary embodiment, after the gas entering into the process chamber 2 from the gas source to complete the chemical vapor deposition reaction, unreacted gas and powder generated by the reaction enter into the vacuum pump 1 through the inlet pipe 12, and the gas entering the vacuum pump 1 is discharged through the air exhaust pipe 13 and enters into the exhaust gas treatment device 3, during which the gas and powder are heated at the inlet end of the air exhaust pipe 13, and the heated inert gas is introduced into the air exhaust pipe 13 and a heat preservation device 18 is provided on the air exhaust pipe 13 to keep the gas and dust in the air exhaust pipe 13 moving at a certain speed, so as to be smoothly discharged through the air exhaust pipe 13.

To sum up, by filling hot inert gas into the air exhaust pipe 13 with the gas tube 14, the gas in the air exhaust pipe end of the pipeline is diluted, thereby reducing the probability of oxidation and condensation reaction between gas and powder, and making the air flow in the air exhaust pipe end whirl, and the probability of powder adhering at the air exhaust outlet and the air exhaust pipe end. By heating pipeline of the vacuum pump 1 to increase the speed of gas and powder molecules moving in the pipeline of the vacuum pump 1 to reduce powder adhesion on the inner wall of the pipeline of the vacuum pump 1, the phenomenon of powder adhesion and blockage in the pipeline of the vacuum pump 1 is effectively improved. The coating layer 19 made of polytetrafluoroethylene can effectively delay the blockage caused by powder adhesion on the inner wall of the pipeline of the vacuum pump 1. It is convenient to operate, easy to modify, the implementation cost is low, and it is conducive to popularize on a large scale.

The foregoing descriptions are merely specific implementation manners of the present application, but are not intended to limit the protection scope of the present application. Any variation or replacement readily figured out by a person skilled in the art within the technical scope disclosed in the present application shall fall within the protection scope of the present application. Therefore, the protection scope of the present application shall be subject to the protection scope of the claims.

What is claimed is:

1. A method for preventing a vacuum pump pipeline from blockage, comprising the following steps:
    opening a gas source, and introducing reaction gas into a process chamber from the gas source;
    carrying out a coating reaction of a chemical vapor deposition machine in the process chamber;
    after coating, closing the gas source, and introducing heated inert gas into an air exhaust pipe connected to an outlet of a vacuum pump; and
    turning on the vacuum pump, and introducing dust and exhaust gas in the process chamber into a exhaust gas treatment device through the air exhaust pipe.

2. The method according to claim 1, wherein after introducing heated inert gas into the air exhaust pipe, the method further comprises an operation of heat preservation of the air exhaust pipe.

3. The method according to claim 1, wherein after the coating and before turning on the vacuum pump, the method further comprises an operation of heating an air inlet pipe connected to an air inlet of the vacuum pump.

4. The method according to claim 1, further comprising plating a coating layer for preventing dust adhesion on an inner wall of the air exhaust pipe to reduce an adhesion probability of powder on the inner wall of the air exhaust pipe.

5. The method according to claim 2, further comprising plating a coating layer for preventing dust adhesion on an inner wall of the air exhaust pipe to reduce an adhesion probability of powder on the inner wall of the air exhaust pipe.

6. The method according to claim 3, further comprising plating a coating layer for preventing dust adhesion on an inner wall of the air exhaust pipe to reduce an adhesion probability of powder on the inner wall of the air exhaust pipe.

7. A chemical vapor deposition machine, comprising a vacuum pump, a process chamber, and an exhaust gas treatment device, an air inlet pipe being connected with the vacuum pump and the process chamber therebetween, and an air exhaust pipe being connected with the exhaust gas treatment device and the vacuum pump therebetween, wherein, one end of the air exhaust pipe near the vacuum pump communicates with a gas tube which is configured to fill inert gas into the air exhaust pipe, the gas tube defines a first heating device, and the chemical vapor deposition machine is defined to prevent the vacuum pump pipe from blockage, comprising the following operations: opening a gas source, and introducing reaction gas into the process chamber from the gas source; carrying out a coating reaction of the chemical vapor deposition machine in the process chamber; after coating, closing the gas source, and introducing heated inert gas into the air exhaust pipe connected to an outlet of the vacuum pump; and turning on the vacuum pump, and introducing dust and exhaust gas in the process chamber into a exhaust gas treatment device through the air exhaust pipe.

8. The chemical vapor deposition machine according to claim 7, wherein the chemical vapor deposition machine is defined to prevent a vacuum pump pipeline from blockage, further comprising an operation of heat preserving the air exhaust pipe after introducing heated inert gas into the air exhaust pipe.

9. The chemical vapor deposition machine according to claim 8, wherein the chemical vapor deposition machine is defined to prevent a vacuum pump pipeline from blockage, further comprising an operation of plating a coating layer for preventing dust adhesion on an inner wall of the air exhaust pipe to reduce an adhesion probability of powder on the inner wall of the air exhaust pipe.

10. The chemical vapor deposition machine according to claim 7, wherein the chemical vapor deposition machine is defined to prevent a vacuum pump pipeline from blockage, further comprising after coating and before turning on the vacuum pump an operation of heating the air inlet pipe connected to an air inlet of the vacuum pump.

11. The chemical vapor deposition machine according to claim 10, wherein the chemical vapor deposition machine is defined to prevent a vacuum pump pipeline from blockage, further comprising an operation of plating a coating layer for preventing dust adhesion on an inner wall of the air exhaust pipe to reduce an adhesion probability of powder on the inner wall of the air exhaust pipe.

12. The chemical vapor deposition machine according to claim 7, further comprising plating a coating layer for preventing dust adhesion on an inner wall of the air exhaust pipe to reduce an adhesion probability of powder on the inner wall of the air exhaust pipe.

13. The chemical vapor deposition machine according to claim 7, wherein the air exhaust pipe defines a heat preservation device.

14. The chemical vapor deposition machine according to claim 7, further comprising a second heating device arranged at one end of the air inlet pipe near the vacuum pump and/or a third heating device arranged at one end of the air exhaust pipe near the vacuum pump.

15. The chemical vapor deposition machine according to claim 7, wherein at least an inner side wall of an air inlet of the air exhaust pipe defines a coating layer for preventing dust adhesion.

16. The chemical vapor deposition machine according to claim 15, wherein the coating layer for preventing dust adhesion is a polytetrafluoroethylene layer.

17. A chemical vapor deposition machine, comprising a vacuum pump, a process chamber, and an exhaust gas treatment device, an air inlet pipe being connected with the vacuum pump and the process chamber therebetween, and an air exhaust pipe being connected with the exhaust gas treatment device and the vacuum pump therebetween, wherein, the chemical vapor deposition machine further comprises: a coating layer, defined on inner side walls of the air inlet pipe and the air exhaust pipe and configured to prevent dust adhesion; a gas tube, communicated with one end of the air exhaust pipe near the vacuum pump and configured to introduce inert gas into the air exhaust pipe; a first heating device, defined on the gas tube and configured to heat inert gas introduced into the gas tube; and a heat preservation device, defined on the air exhaust pipe and configured to perform heat preservation of an environment in the air exhaust pipe.

\* \* \* \* \*